(12) United States Patent
Ilardi et al.

(10) Patent No.: US 7,928,046 B2
(45) Date of Patent: Apr. 19, 2011

(54) STRIPPING AND CLEANING COMPOSITIONS FOR MICROELECTRONICS

(75) Inventors: Joseph M. Ilardi, Sparta, NJ (US); David C. Skee, Bethlehem, PA (US); Sean M. Kane, Lyndhurst, OH (US); Karen E. Trovalli, Easton, PA (US)

(73) Assignee: Avantor Performance Materials, Inc., Phillipsburg, NJ (US)

( * ) Notice: Subject to any disclaimer, the term of this patent is extended or adjusted under 35 U.S.C. 154(b) by 931 days.

(21) Appl. No.: 11/349,635

(22) Filed: Feb. 8, 2006

(65) Prior Publication Data

US 2006/0154839 A1 Jul. 13, 2006

Related U.S. Application Data

(63) Continuation-in-part of application No. PCT/US2004/024153, filed on Jul. 26, 2004.

(60) Provisional application No. 60/496,110, filed on Aug. 19, 2003, provisional application No. 60/548,976, filed on Mar. 1, 2004.

(51) Int. Cl.
C11D 7/32 (2006.01)

(52) U.S. Cl. ........................ 510/175; 134/1.3

(58) Field of Classification Search .................. 510/175; 134/1.3
See application file for complete search history.

(56) References Cited

U.S. PATENT DOCUMENTS

| | | | |
|---|---|---|---|
| 2,962,394 A | 11/1960 | Andres | |
| 3,415,679 A | 12/1968 | Chuss | |
| 3,476,658 A | 11/1969 | Corwin | |
| 3,615,471 A | 10/1971 | Lenoble et al. | |
| 3,632,436 A | 1/1972 | Denning | |
| 3,666,529 A | 5/1972 | Wright et al. | |
| 4,786,429 A * | 11/1988 | Mori et al. | 252/62.2 |
| 5,181,988 A * | 1/1993 | Akutsu et al. | 162/135 |
| 5,232,744 A | 8/1993 | Nakamura | |
| 5,259,888 A * | 11/1993 | McCoy | 134/2 |
| 5,266,103 A * | 11/1993 | Uchida et al. | 106/1.22 |
| 5,637,743 A * | 6/1997 | Contet et al. | 554/52 |
| 5,972,862 A * | 10/1999 | Torii et al. | 510/175 |
| 6,137,027 A * | 10/2000 | Kawashima et al. | 588/316 |
| 6,309,477 B1 * | 10/2001 | Shimakura et al. | 148/253 |
| 6,475,472 B2 * | 11/2002 | Joiner et al. | 424/53 |
| 6,579,439 B1 * | 6/2003 | Chandler | 205/671 |
| 6,680,286 B1 * | 1/2004 | Kawaguchi et al. | 510/434 |
| 6,797,682 B2 * | 9/2004 | Hara et al. | 510/175 |
| 7,521,406 B2 * | 4/2009 | Hsu | 510/175 |
| 2002/0077259 A1 * | 6/2002 | Skee | 510/175 |
| 2002/0128164 A1 * | 9/2002 | Hara et al. | 510/175 |
| 2003/0232148 A1 * | 12/2003 | Shahin | 427/438 |
| 2004/0134873 A1 * | 7/2004 | Yao et al. | 216/2 |
| 2004/0224866 A1 * | 11/2004 | Matsunaga et al. | 510/175 |
| 2005/0176259 A1 * | 8/2005 | Yokoi et al. | 438/745 |
| 2005/0176603 A1 * | 8/2005 | Hsu | 510/175 |
| 2005/0287480 A1 * | 12/2005 | Takashima | 430/331 |
| 2006/0154839 A1 * | 7/2006 | Ilardi et al. | 510/175 |
| 2007/0060490 A1 * | 3/2007 | Skee | 510/175 |
| 2007/0175862 A1 * | 8/2007 | Yamada et al. | 216/83 |

FOREIGN PATENT DOCUMENTS

| | | |
|---|---|---|
| CN | 1271767 A | 4/2000 |
| FR | 2206583 | 11/1972 |
| JP | 2000-208467 | 7/2000 |
| JP | 2001-44161 | 2/2001 |
| WO | WO 99/60448 | 11/1999 |
| WO | WO 03/006597 | 1/2003 |

OTHER PUBLICATIONS

Richard J. Lewis, Sr., Hawley's Condensed Chemical Dictionary (Twelfth Edition), Copyright 1993, Van Nostrand Reinhold Company, New York, pp. 66, 69.*
AN 1984 189070 XP002308596, Database WPI Section Ch, Week 198441, Derwent Publications Ltd., London, GB; DD 210 592 A (Kovaldova D.), Jun. 13, 1984 abstract.
AN 1992 396958 XP002308597, Database WPI Section Ch, Week 199248, Derwent Publications Ltd., London, GB; "Soln for removing flux residues and cleaning metals" & SU 1 706 815 a (Zavod Im Malysheva Prodn Assoc) Jan. 23, 1992 abstract.

* cited by examiner

*Primary Examiner* — Gregory E Webb
(74) *Attorney, Agent, or Firm* — Ohlandt, Greeley, Ruggiero & Perle, LLP; George W. Rauchfuss, Jr.

(57) ABSTRACT

Aqueous, silicate free, cleaning compositions of about pH 9 or below and method of using the cleaning compositions for cleaning microelectronic substrates, which compositions are able to essentially completely clean such substrates and produce essentially no metal corrosion of the metal elements of such substrates. The aqueous cleaning compositions of this invention have (a) water, (b) at least one of ammonium and quaternary ammonium ions and (c) at least one of hypophosphite ($H_2PO_2^-$) and/or phosphite ($HPO_3^{2-}$) ions. The cleaning compositions also may contain fluoride ions. Optionally, the composition may contain other components such as organic solvents, oxidizing agent, surfactants, corrosion inhibitors and metal complexing agents.

28 Claims, No Drawings ns for Microelectronics

STRIPPING AND CLEANING COMPOSITIONS FOR MICROELECTRONICS

RELATED APPLICATIONS

This application is a continuation-in part of the US designated PCT Application No. PCT/US 2004/024153, filed Jul. 26, 2004, claiming priority of U.S. Provisional application Nos. 60/496,110, filed Aug. 19, 2003 and 60/548,976, filed Mar. 1, 2004, priority of which are claimed for this CIP application.

FIELD OF THE INVENTION

This invention relates to methods and aqueous post-etch and/or photoresist ash residue cleaning compositions for cleaning microelectronics substrates. The compositions of this invention provide enhanced protection of metal, i.e., inhibition of corrosion, when such microelectronic substrates are subjected to cleaning and a subsequent aqueous rinse.

BACKGROUND TO THE INVENTION

Many photoresist strippers and residue removers have been proposed for use in the microelectronics field as downstream or back end of the manufacturing line cleaners. In the manufacturing process a thin film of photoresist is deposited on a substrate material, and then circuit design is imaged on the thin film. Following baking, the exposed resist is removed with a photoresist developer. The resulting image is then transferred to the underlying material, which is generally a dielectric or metal, by way of plasma etch gases or chemical etchant solutions. The etchant gases or chemical etchant solutions selectively attack the photoresist-unprotected area of the substrate. As a result of the plasma etching process, photoresist and etched material by-products are deposited as residues around or on the sidewall of the etched openings on the substrate and the photoresist.

Additionally, following the termination of the etching step, the resist mask must be removed from the protected area of the substrate so that the next process operation can take place. This can be accomplished in a plasma ashing step by the use of suitable plasma ashing gases or wet chemical strippers. Finding a suitable cleaning composition for removal of this resist mask material without adversely affecting, e.g., corroding, etching or dulling, the metal circuitry has also proven problematic.

As microelectronic fabrication integration levels have increased and patterned microelectronic device dimensions have decreased, it has become increasingly difficult to provide suitable photoresist stripping and cleaning compositions that provide suitable stripping and cleaning properties without producing other detrimental effects. In the area of semiconductors and flat panel displays (FPD), the problem of metal corrosion during photoresist stripping, residue removal and the water rinse is a severe drawback, particularly with the use of select metals such as aluminum, titanium, and tungsten and alloys.

A typical residue remover for microelectronic applications might be an alkaline-containing composition that includes polar organic solvents blended with organic amines or hydroxylamines and other solvating agents in an attempt to lessen metal and dielectric attack or corrosion. Amines and hydroxylamines have been shown to increase the effectiveness of photoresist and residue removal in solvent blends. However, such alkaline ash residue removal formulations experience carbon dioxide uptake from the air, which in most cases shortens the cleaner solution's effective bath life. Moreover, these alkaline cleaner compositions are relatively slow acting and require the substrates to be kept in the cleaner solutions for extended times at elevated temperatures. Moreover, the water rinse following this type of remover can create a strongly alkaline aqueous solution and that can lead to considerable loss of metal from the patterned lines. This necessitates an intermediate rinse between the cleaning/stripping step and the aqueous rinse. Such an intermediate rinse, typically with isopropyl alcohol, adds undesirable time, safety concerns, environmental consequences, and cost to the manufacturing process.

There is, therefore, a need for stripping and cleaning compositions for photoresists and residues that enable one to completely remove etch and/or ash residue from the microelectronic substrate, especially a need for such cleaner and residue removing compositions that do not produce any significant metal corrosion.

SUMMARY OF THE INVENTION

The invention provides aqueous, silicate-free cleaning compositions for cleaning microelectronic substrates that are able to essentially completely clean such substrates and produce essentially no metal corrosion of the metal elements of such substrates, and to do so at relatively short cleaning times and relatively low temperatures compared to the cleaning times required for prior art alkaline-containing cleaning compositions. The invention also provides method of using such aqueous, silicate-free, cleaning compositions to clean microelectronic substrates, particularly FPD microelectronic substrates, without producing any significant metal corrosion of the metal elements of the microelectronic substrate. The aqueous, silicate-free, cleaning compositions of this invention comprise (a) water, (b) at least one of ammonium or quaternary ammonium ions and (c) at least one of hypophosphite ($H_2PO_2^-$) or phosphite ($HPO_3^{2-}$) ions, and the compositions have a pH of about 9 or below, preferably a pH of about 7 or below, and more preferably a pH of about 6 or below. It will be appreciated that both ammonium and quaternary ammonium ions may be present in a composition of this invention, and both hypophosphite and phosphite ions also may both be present in a composition of this invention. In a further embodiment of the invention the cleaning compositions of this invention also preferably contain fluoride ions. The cleaning compositions of this invention optionally can have present in the compositions other components, such as for example surfactants, metal complexing or chelating agents, organic solvents and the like. The cleaning and residue removal compositions of this invention are especially suitable for cleaning microelectronic substrates.

DETAILED DESCRIPTION OF THE INVENTION AND PREFERRED EMBODIMENTS

The aqueous, silicate-free, cleaning compositions of this invention contain water generally in an amount of from about 60% to about 99.5%, preferably from about 75% to about 99%, more preferably from about 80% to about 98%, and most preferably from about 83% to about 98%, by weight of the composition.

The aqueous, silicate-free cleaning compositions of this invention contain hypophosphite and/or phosphite ions and ammonium ions. The hypophosphite/phosphite and ammonium/quaternary ammonium ions are preferably provided by ammonium salts of the phosphites employed in an amount of from about 0.5% to about 40%, generally from about 1% to about 25%, preferably from about 2% to about 20%, more preferably from about 2% to about 17%, and in some instances 1.8% to 2.0%, by weight of the composition. The hypophosphite/phosphite and ammonium ions can also be provided by other components suitable for providing such ions, e.g., by providing in the compositions hypophosphorous and or phosphorous acid or their salts, preferably sodium salts, in combination with ammonium or quaternary ammonium, preferably tetraalkylammonium salts. In any event the combination of components will have a pH of about 9 or below, preferably a pH of about 7 or below, and more preferably a pH of about 6 or below, and will be sufficient to provide in the cleaning compositions of this invention hypophosphite/phosphite ions and ammonium/quaternary ammonium ions in an amount equivalent to that which would be contributed by the ammonium salts as stated hereinbefore. That is, the components contributing the hypophosphite/phosphite ions and ammonium/quaternary ammonium ions constitute, in total from about 0.5% to about 40%, preferably from about 1% to about 25%, more preferably from about 2% to about 20%, and most preferably from about 2% to about 17%, by weight of the composition.

The aqueous cleaning compositions of this invention will, in a preferred embodiment, also contain fluoride ions from any suitable fluoride compound, such as for example, from hydrogen fluoride, a tetraalkylammonium fluoride such as tetramethylammonium fluoride and tetrabutylammonium fluoride, and ammonium fluoride. Other suitable fluorides include, for example fluoroborates, tetrabutylammonium fluoroborates, aluminum hexafluorides, antimony fluoride and the like. The fluoride components will generally be present in the composition an amount of 0 ppm up to about 10,000 ppm or 0% up to about 1% by weight of the composition, preferably in an amount of from about 10 to about 5,000 ppm or 0.001% to about 0.5% by weight of the composition, and more preferably from about 10 ppm to about 2000 ppm. or 0.001% to about 0.2% weight of the composition.

The aqueous cleaning compositions of this invention may, and preferably do, also contain one or more suitable water-soluble organic solvents. Among the various organic solvents suitable are alcohols, polyhydroxy alcohols, such as glycerol, glycols, glycol ethers, alkyl-pyrrolidinones such as N-methylpyrrolidinone (NMP), 1-hydroxyalkyl-2-pyrrolidinones such as, 1-(2-hydroxyethyl)-2-pyrrolidinone (HEP), dimethylformamide (DMF), dimethylacetamide (DMAc), sulfolane or dimethylsulfoxide (DMSO). These solvents may be added to limit the aggressiveness of the cleaning compositions and to reduce metal, especially aluminum or aluminum alloy corrosion rates if further aluminum and/or aluminum-alloy corrosion inhibition is desired. Preferred water-soluble organic solvents are polyhydroxy alcohols such as glycerol, N-methylpyrrolidinone and/or 1-hydroxyalkyl-2-pyrrolidinones such as 1-(2-hydroxyethyl)-2-pyrrolidinone (HEP). Such organic solvents may be employed in an amount of up from 0% to about 50% by weight based on the weight of the composition, preferably in an amount of about 5% to about 50% by weight and more preferably in an amount of from about 10% to about 50% by weight.

The cleaning compositions of this invention also will preferably contain an oxidizing agent to provide further protection against metal, especially aluminum, corrosion. Any suitable oxidizing agent, including, but not limited to, hydrogen peroxide, persulfates, perphosphates, hyposulfites, hypochlorites and the like may be employed in the cleaning compositions of this invention. The preferred oxidizing agent is hydrogen peroxide. The amount of oxidizing agent employed will generally be in an amount of from 0% up to about 5%, preferably from about 0.25% to about 5%, more preferably from about 0.5% to 3%, and most preferably from about 0.6% to about 1.5%, by weight of the composition.

The compositions of the present invention may also contain any suitable water-soluble amphoteric, non-ionic, cationic or anionic surfactant. The addition of a surfactant will reduce the surface tension of the formulation and improve the wetting of the surface to be cleaned and therefore improve the cleaning action of the composition. The surfactant may also be added to reduce aluminum corrosion rates if further aluminum corrosion inhibition is desired. Amphoteric surfactants useful in the compositions of the present invention include betaines and sulfobetaines such as alkyl betaines, amidoalkyl betaines, alkyl sulfobetaines and amidoalkyl sulfobetaines; aminocarboxylic acid derivatives such as amphoglycinates, amphopropionates, amphodiglycinates, and amphodipropionates; iminodiacids such as alkoxyalkyl iminodiacids or alkoxyalkyl iminodiacids; amine oxides such as alkyl amine oxides and alkylamido alkylamine oxides; fluoroalkyl sulfonates and fluorinated alkyl amphoterics; and mixtures thereof. Preferably, the amphoteric surfactants are cocoamidopropyl betaine, cocoamidopropyl dimethyl betaine, cocoamidopropyl hydroxy sultaine, capryloamphodipropionate, cocoamidodipropionate, cocoamphopropionate, cocoamphohydroxyethyl propionate, isodecyloxypropylimino dipropionic acid, laurylimino dipropionate, cocoamidopropylamine oxide and cocoamine oxide and fluorinated alkyl amphoterics. Non-ionic surfactants useful in the compositions of the present invention include acetylenic diols, ethoxylated acetylenic diols, fluorinated alkyl alkoxylates, fluorinated alkylesters, fluorinated polyoxyethylene alkanols, aliphatic acid esters of polyhydric alcohols, polyoxyethylene monoalkyl ethers, polyoxyethylene diols, siloxane type surfactants, and alkylene glycol monoalkyl ethers. Preferably, the non-ionic surfactants are acetylenic diols or ethoxylated acetylenic diols. Anionic surfactants useful in the compositions of the present invention include carboxylates, N-acylsarcosinates, sulfonates, sulfates, and mono and diesters of orthophosphoric acid such as decyl phosphate. Preferably, the anionic surfactants are metal-free surfactants. Cationic surfactants useful in the compositions of the present invention include amine ethoxylates, dialkyldimethylammonium salts, dialkylmorpholinum salts, alkylbenzyldimethylammonium salts, alkyltrimethylammonium salts, and alkylpyridinium salts. Preferably, the cationic surfactants are halogen-free surfactants. Examples of especially suitable surfactants include, but are not limited to 3,5-dimethyl-1-hexyn-3-ol (Surfynol-61), ethoxylated 2,4,7,9-tetramethyl-5-decyne-4,7-diol (Surfynol-465), polytetrafluoroethylene cetoxypropylbetaine (Zonyl FSK), Zonyl FSH, Triton X-100, namely octylphenoxypolyethoxyethanol, and the like. The surfactant will generally be present in an amount of from 0 to about 5 wt %, preferably 0.001 to about 3 wt % based on the weight of the composition.

The aqueous cleaning compositions of this invention can also optionally contain other components, including but not limited to, corrosion inhibitors and similar non-corrosive components employed in microelectronic cleaner compositions. The compounds may include catechol, resorcinol, gallic acid, propyl gallate, pyrogallol, hydroquinone, derivatives of benzotriazole, and polyfunctional carboxylic acids such as citric acid, tartaric acid, gluconic acid, saccharic acid, glyceric acid, oxalic acid, phthalic acid, maleic acid, mandelic acid, malonic acid, lactic acid, and salicylic acid.

Organic or inorganic chelating or metal complexing agents are not required, but offer substantial benefits, such as for example, improved product stability when incorporated into the aqueous cleaning compositions of this invention. Examples of suitable chelating or complexing agents include but are not limited to trans-1,2-cyclohexanediamine tetraacetic acid (CyDTA), ethylenediamine tetraacetic acid (EDTA), stannates, pyrophosphates, alkylidene-diphosphonic acid derivatives (e.g. ethane-1-hydroxy-1,1-diphosphonate), phosphonates containing ethylenediamine, diethylenetriamine or triethylenetetramine functional moieties (e,g. ethylenediamine tetra(methylene phosphonic acid) (EDTMP), diethylenetriamine penta(methylene phosphonic acid), triethylenetetramine hexa(methylene phosphonic acid). The chelating agent will be present in the composition in an amount of from 0 to about 5 wt %, preferably from about 0.1 to about 2 wt % based on the weight of the composition. Metal chelating or complexing agents of various phosphonates, such as ethylenediamine tetra(methylene phosphonic acid) (EDTMP) offer much improved stabilization of the cleaning compositions of the cleaning compositions of this invention when they are combined with oxidizing agents at acidic and alkaline conditions and thus are generally preferred.

In one preferred embodiment of the invention the cleaning composition comprises water and ammonium hypophosphite, especially 2 wt % ammonium hypophosphite in 98 wt % water. Another preferred cleaning composition of this invention comprises a composition of water, ammonium hypophosphite and hydrofluoric acid. A still further preferred embodiment of a cleaning composition of this invention comprises water, ammonium hypophosphite, hydrofluoric acid, glycerol and hydrogen peroxide. An additional preferred composition comprises hypophosphorous and/or phosphorous acid, ammonium hydroxide, and water.

The compositions on this invention, their use to clean microelectronic substrates and their non-metal corroding properties is illustrated by, but not limited to, the following examples.

EXAMPLE 1-5

Ammonium hypophosphite, DI water and 50:1 HF were mixed to give a solution of 2 weight % ammonium hypophosphite, 98 weight % water and 100 ppm fluoride ion to provide a cleaning composition of this invention. The pH of the solution was 4.3. A given quantity of this solution was placed in a beaker and brought to 45° C. Patterned silicon wafer samples having TiN/Al/TiN/PTEOS layers were placed in the heated solution for a prescribed time after which they were removed, rinsed in DI water and blown dry with nitrogen. A Scanning Electron Micrograph (SEM) was taken of the cleaned wafer samples and evaluated as to the degree of ash removal and aluminum metal corrosion. The results in Table 1 demonstrate the cleaning and relatively non-corrosive nature of the composition of this invention.

TABLE 1

| Example No. | Immersion Time (min) | % Ash removed | Aluminum corrosion Å/min |
|---|---|---|---|
| 1 | 1.0 | 100 | 1058 |
| 2 | 1.5 | 100 | — |
| 3 | 2.0 | 100 | — |
| 4 | 2.5 | 100 | 1084 |
| 5 | 3.0 | 100 | 1033 |

EXAMPLES 6-10

The solution employed in Examples 1-5 was also employed in the following Examples 6-10. The wafer employed in Examples 6-10 were wafers of the type employed in Examples 1-5 with vias patterned through the PTEOS stopping on top of the underlying TiN layer. The cleaning solution was the same as that of Examples 1-5. The wafers were placed in the heated (45° C.) solution for a prescribed time after which they were removed, rinsed in DI water and blown dry with nitrogen. A Scanning Electron Micrograph (SEM) was taken of the cleaned wafer samples and evaluated as to the degree of ash removal and aluminum metal corrosion. The results are reported in Table 2 showing the increasing aggressive nature of the compositions of this invention when employed for longer cleaning periods.

TABLE 2

| Example No. | Immersion Time (min) | % Ash removed | % Aluminum corrosion |
|---|---|---|---|
| 6 | 2.0 | 3 | 0 |
| 7 | 2.5 | 40 | 0 |
| 8 | 3.0 | 50 | 0 |
| 9 | 3.5 | 90 | 20 |
| 10 | 40 | 100 | 80 |

EXAMPLES 11-12

Patterned wafers of the same type as employed in Example 1-5 were employed in Examples 11 and 12. The cleaning solution employed was that employed in Examples 1-5 but with the addition of glycerol thereto in an amount that the glycerol constituted approximately 10 weight % of the composition. The solution still had a pH of 4.3. The wafers were placed in the heated (45° C.) solution for a prescribed time after which they were removed, rinsed in DI water and blown dry with nitrogen. A Scanning Electron Micrograph (SEM) was taken of the cleaned wafer samples and evaluated as to the degree of ash removal and aluminum metal corrosion. The results are reported in Table 3 and show a further approximately 10% reduction in aluminum corrosion.

TABLE 3

| Example No. | Immersion Time (min) | % Ash removed | Aluminum corrosion Å/min |
|---|---|---|---|
| 11 | 2.5 | 100 | 952 |
| 12 | 3.0 | 100 | 903 |

EXAMPLE 13-14

Wafers with vias of the same type as employed in Example 6-10 were employed in Examples 13 and 14. The cleaning solution employed was that employed in Examples 11 and 12. The wafers were placed in the heated (45° C.) solution for a prescribed time after which they were removed, rinsed in DI water and blown dry with nitrogen. A Scanning Electron Micrograph (SEM) was taken of the cleaned wafer samples and evaluated as to the degree of ash removal and aluminum metal corrosion. The results are reported in Table 4 and show a further significant reduction in aluminum corrosion even at the extended cleaning periods when the composition is a more aggressive cleaner, as had been indicated by the previous results in Table 2.

TABLE 4

| Example No. | Immersion Time (min) | % Ash removed | % Aluminum corrosion |
|---|---|---|---|
| 13 | 3.5 | 100 | 20 |
| 14 | 4.0 | 100 | 20 |

EXAMPLES 15-16

In Example 15 the wafer employed was the same as the wafer described in Example 1-5 and in Example 16 the wafer with vias employed was the same as the wafer described in Example 6-10. The cleaning composition employed was that of the type described in the previous Examples but with the addition of hydrogen peroxide. The cleaning solution comprised 1.8 weight % ammonium hypophosphite, 88.4 weight % water, 8.8 weight 5 glycerol, 0.6 weight % hydrogen peroxide and slightly less than 100 ppm fluoride ion and had a pH of 4.3. The wafers were placed in the heated (45° C.) solution for a prescribed time after which they were removed, rinsed in DI water and blown dry with nitrogen. A Scanning Electron Micrograph (SEM) was taken of the cleaned wafer samples and evaluated as to the degree of ash removal and aluminum metal corrosion. The results are reported in Table 5 and show a further significant reduction in aluminum corrosion for both types of wafers

TABLE 5

| Example No. | Immersion Time (min) | % Ash removed | Aluminum corrosion Å/min | % Aluminum corrosion |
|---|---|---|---|---|
| 15 | 1.5 | 100 | 840 | — |
| 16 | 3.0 | 100 | — | 0 |

EXAMPLE 17

A composition of this invention was prepared having the following composition: 100 g DI water, 25.0 g 1.0% hydrofluoric acid, 4.27 g 24.96% tetramethylammonium hydroxide solution in water, 20.0 g glycerol, 2.0 g sodium hypophosphite monohydrate (from Alfa Aesar) and 0.08 weight 5 Triton X-100 surfactant. The composition had a pH of approximately 6.0 at room temperature. A wafer sample having PTEOS/TiN/Al-0.5% Cu layers with via patterned through the PTEOS stopping on top of the underlying TiN layer was plasma ashed to remove bulk photoresist after the via etching. The wafer was treated for 20 minutes at 25° C. in the cleaning solution. SEM cross-sectional inspection of 0.18 micron wide vias with a 5:1 aspect (height:width) ratio showed the vias were completely clean and contained no residue.

EXAMPLE 18

A cleaning composition of this invention was prepared having the following composition: 100.00 g DI water, 25.54 g 1% hydrofluoric acid solution in water, 5.96 g 25.08% tetramethylammonium hydroxide solution in water, 60.00 g glycerol, and 2.00 g ammonium hypophosphite (97% from Fluka). The composition had a pH of 8.36 at 25° C. Patterned metal-line wafer samples with 1 micron wide features with TiN/Al-0.5% Cu/TiN/Ti/sog layers were plasma ashed to remove bulk photoresist after metal etching. The wafer was treated in the cleaning composition for 2 minutes at 30° C. SEM inspection showed 99.5% residue removal with no observable metal corrosion.

EXAMPLES 19-21

Cleaning compositions of this invention were prepared by mixing ammonium hypophosphite and DI water to provide a solution comprising just ammonium hypophosphite and water. Patterned silicon wafer samples having TiN/Al/TiN/PTEOS layers were placed in the heated solutions of the cleaning composition for 15 minutes after which they were removed, rinsed in DI water and blown dry with nitrogen. The cleaned wafers were then evaluated for ash residue removal (0=no removal to 10+100% removal) and aluminum corrosion (0=no corrosion to 10=severe corrosion). The percent ammonium hypophosphite, the pH of the solutions, the temperature of the heated solution in which the wafer were placed and the aluminum corrosion and ash removal results are set forth in Table 6.

TABLE 6

| Example No. | % Ammonium hypophosphite | pH | Temp ° C. | Aluminum corrosion | Ash residue removal |
|---|---|---|---|---|---|
| 19 | 1.6 | 3 | 45 | 0 | 10 |
| 20 | 3.2 | 3 | 25 | 1 | 10 |
| 21 | 2.4 | 4 | 35 | 0 | 10 |

EXAMPLES 22-27

Cleaning compositions of this invention were prepared by mixing hypophosphorous and phosphorous acid, ammonium hydroxide, and DI water. Patterned silicon wafer samples having TiN/Al/TiN/PTEOS layers were placed in solutions of the cleaning composition heated to 45° C. for 15 minutes after which they were removed, rinsed in DI water and blown dry with nitrogen. The cleaned wafers were then evaluated for ash residue removal (0=no removal to 10=100% removal) and aluminum corrosion (0=no corrosion to 10=severe corrosion). The percent of each phosphite, the pH of the solutions, and the aluminum corrosion and ash removal results are shown in Table 7.

TABLE 7

| Example No. | % hypo-phosphite | % phosphite | % NH$_4$OH | pH | Aluminum corrosion | Ash residue removal |
|---|---|---|---|---|---|---|
| 22 | 15 | 1 | 0.3 | 4.50 | 1 | 10 |
| 23 | 15 | 2 | 0.6 | 4.49 | 2 | 10 |
| 24 | 15 | 6 | 2.3 | 4.47 | 2 | 10 |
| 25 | 30 | 1 | 0.2 | 4.75 | 0 | 9 |
| 26 | 30 | 2 | 0.6 | 4.54 | 1 | 10 |
| 27 | 30 | 6 | 2.5 | 4.48 | 2 | 10 |

EXAMPLES 28-34

Cleaning compositions of this invention were prepared by mixing only phosphorous acid, ammonium hydroxide, and DI water. Patterned silicon wafer samples having TiN/Al/TiN/PTEOS layers were placed in solutions of the cleaning composition heated to 45° C. for 15 minutes after which they were removed, rinsed in DI water and blown dry with nitrogen. The cleaned wafers were then evaluated for ash residue removal (0=no removal to 10=100% removal) and aluminum corrosion (0=no corrosion to 10=severe corrosion). The percent phosphorous acid, the pH of the solutions, and the aluminum corrosion and ash removal results are shown in

TABLE 8

| Example No. | % phosphorous acid | % NH₄OH | PH | Aluminum corrosion | Ash residue removal |
|---|---|---|---|---|---|
| 28 | 1 | 0.1 | 1.3 | 6 | 10 |
| 29 | 1 | 0.5 | 5.6 | 0 | 10 |
| 30 | 2 | 0.4 | 3.4 | 4 | 10 |
| 31 | 2 | 0.9 | 4.5 | 1 | 10 |
| 32 | 2 | 1.4 | 6.0 | 0 | 10 |
| 33 | 6 | 2.7 | 3.4 | 6 | 10 |
| 34 | 6 | 4.3 | 6.0 | 2 | 10 |

EXAMPLES 35-40

Cleaning compositions of this invention were prepared by mixing phosphorous acid (final concentration 2%), DI water, and select strong bases to achieve approximately pH=4.5. These bases were: tetramethylammonium hydroxide (TMAH), tetraethylammonium hydroxide (TEAH), tetrapropylammonium hydroxide (TPAH), tetrabutylammonium hydroxide (TBAH), cetyltrimethylammonium hydroxide (CTMAH), and tetraethanolammonium hydroxide (TEtOHAH). Patterned silicon wafer samples having TiN/Al/TiN/PTEOS layers were placed in solutions of the cleaning composition heated to 45° C. for 15 minutes after which they were removed, rinsed in DI water and blown dry with nitrogen. The cleaned wafers were then evaluated for ash residue removal (0=no removal to 10=100% removal) and aluminum corrosion (0=no corrosion to 10=severe corrosion). The above abbreviation for the base, the pH of the solutions, and the aluminum corrosion and ash removal results are shown in Table 9.

TABLE 9

| Example No. | Strong Base | pH | Aluminum corrosion | Ash residue removal |
|---|---|---|---|---|
| 35 | TMAH | 4.5 | 0 | 10 |
| 36 | TEAH | 4.5 | 1 | 10 |
| 37 | TPAH | 4.5 | 0 | 9 |
| 38 | TBAH | 4.6 | 0 | 8 |
| 39 | CTMAH | 4.5 | 0 | 8 |
| 40 | TEtOHAH | 5.0 | 0 | 7 |

EXAMPLES 41-44

Cleaning compositions of this invention were prepared by mixing phosphorous acid, ammonium hydroxide, with and without catechol, and DI water. Patterned silicon wafer samples having TiN/Al/TiN/PTEOS layers were placed in solutions of the cleaning composition heated to 35° C. for 10 minutes after which they were removed, rinsed in DI water and blown dry with nitrogen. The cleaned wafers were then evaluated for ash residue removal (0=no removal to 10=100% removal) and aluminum corrosion (0=no corrosion to 10=severe corrosion). The percent phosphorous acid, ammonium hydroxide, and catechol, the pH of the solutions, and the aluminum corrosion and ash removal results in Table 9 showing the additional beneficial results obtained by the use of a corrosion inhibiting compound, such as catechol, in the compositions of this invention.

TABLE 10

| Example No. | % phosphite | % NH₄OH | % catechol | pH | Aluminum corrosion | Ash residue removal |
|---|---|---|---|---|---|---|
| 41 | 2.5 | 0.7 | 0 | 3.2 | 1 | 10 |
| 42 | 2.5 | 0.7 | 3 | 3.2 | 0 | 10 |
| 43 | 2.5 | 0.3 | 0 | 2.2 | 3 | 10 |
| 44 | 2.5 | 0.3 | 3 | 2.1 | 1 | 10 |

While the invention has been described herein with reference to the specific embodiments thereof, it will be appreciated that changes, modification and variations can be made without departing from the spirit and scope of the inventive concept disclosed herein. Accordingly, it is intended to embrace all such changes, modification and variations that fall with the spirit and scope of the appended claims.

We claim:
1. An aqueous, silicate free, composition of pH about 6 or below for cleaning microelectronic substrates and minimizing aluminum corrosion, the composition consisting of:
    (1) from about 60% to about 99.5% by weight water; and
    (2) from about 0.5% to about 40% by weight of ammonium hydroxide and an acid selected from the group consisting of hypophosphorus acid and phosphorus acid; and optionally
    (3) fluoride ions,
    (4) surfactant
    (5) metal complexing or chelating agent,
    (6) water-soluble organic solvent, and
    (7) oxidizing agent.
2. An aqueous composition according to claim 1 additionally consisting of fluoride ions.
3. An aqueous composition according to claim 2 wherein the fluoride ions are provided by the presence in the composition of hydrogen fluoride.
4. An aqueous composition according to claim 1 wherein at least one further of the optional components selected from the group consisting of a water-soluble organic solvent and an oxidizing agent is present in the composition.
5. An aqueous composition according to claim 4 wherein both the water-soluble organic solvent and the oxidizing agent are present in the composition and the organic solvent is selected from the group consisting of glycerol, 2-pyrrolidinone, 1-methyl-2-pyrrolidinone, 1-ethyl-2-pyrrolidinone, 1-propyl-2-pyrrolidinone, 1-hydroxyethyl-2-pyrrolidinone, a dialkyl sulfone, dimethyl sulfoxide, a tetrahydrothiophene-1,1-dioxide, dimethylacetamide and dimethylformamide and the oxidizing agent is selected from the group consisting of hydrogen peroxide, persulfates, perphosphates, hyposulfites, hypochlorites.
6. An aqueous composition according to claim 5 wherein the water-soluble organic solvent is glycerol and the oxidizing agent is hydrogen peroxide.
7. An aqueous composition according to claim 1 wherein the composition consists of water, hypophosphorus acid and phosphorous acid and ammonium hydroxide.
8. An aqueous composition according to claim 1 consisting of water, phosphorous acid and ammonium hydroxide.
9. A process for cleaning a microelectronic substrate without producing any substantial metal corrosion, the substrate containing photoresist polymeric material and/or residues and a metal, the process comprising contacting the substrate with an aqueous, silicate-free, cleaning composition for a time sufficient to clean the substrate, wherein the aqueous, siliate-free, cleaning composition has a pH of about 6 or below and consists of:

(1) from about 60% to about 99.5% by weight water, and
(2) from about 0.5% to about 40% by weight of ammonium hydroxide and an acid selected from the group consisting of hypophosphorus acid and phosphorous acid; and optionally
(3) fluoride ions,
(4) surfactant
(5) metal complexing or chelating agent,
(6) water-soluble organic solvent, and
(7) oxidizing agent.

10. A method according to claim 9 wherein the cleaning composition additionally consists of fluoride ions.

11. A method according to claim 9 wherein the cleaning composition additionally consists of wherein the fluoride ions are provided by the presence in the composition of hydrogen fluoride.

12. A method according to claim 9 wherein the cleaning composition additionally consists of at least one further component selected from the group consisting of a water-soluble organic solvent and an oxidizing agent.

13. A method according to claim 12 wherein both the water-soluble organic solvent and the oxidizing agent are present in the composition and the organic solvent is selected from the group consisting of glycerol, 2-pyrrolidinone, 1-methyl-2-pyrrolidinone, 1-ethyl-2-pyrrolidinone, 1-propyl-2-pyrrolidinone, 1-hydroxyethyl-2-pyrrolidinone, a dialkyl sulfone, dimethyl sulfoxide, a tetrahydrothiophene-1,1-dioxide, dimethylacetamide and dimethylformamide and the oxidizing agent is selected from the group consisting of hydrogen peroxide, persulfates, perphosphates, hyposulfites, hypochlorites.

14. A method according to claim 13 wherein the water-soluble organic solvent is glycerol and the oxidizing agent is hydrogen peroxide.

15. A method according to according to claim 9 wherein the composition consists of water, hypophosphorus and phosphorous acid and ammonium hydroxide.

16. A method according to according to claim 9 consisting of water, phosphorous acid and ammonium hydroxide.

17. A composition of claim 1 consisting of water, ammonium hydroxide and hypophposphorus acid.

18. A process for cleaning a microelectronic substrate without producing any substantial metal corrosion, the substrate containing photoresist polymeric material and/or residues and a metal, the process comprising contacting the substrate with an aqueous, silicate-free, cleaning composition for a time sufficient to clean the substrate, wherein the aqueous, siliate-free, cleaning composition has a pH of about 6 or below and consists of a composition of claim 17.

19. An aqueous, silicate free, composition of pH about 6 or below for cleaning microelectronic substrates and minimizing aluminum corrosion, the composition consisting of:
(1) from about 60% to about 99.5% by weight water;
(2) from about 0.5% to about 40% by weight of at least one of (a) ammonium hypophosphite, (b) ammonium phosphite;
(3) fluoride ions;
and optionally
(4) surfactant
(5) metal complexing or chelating agent,
(6) water-soluble organic solvent, and
(7) oxidizing agent.

20. An aqueous composition according to claim 19 wherein the fluoride ions are provided by the presence in the composition of hydrogen fluoride.

21. An aqueous composition according to claim 19 wherein at least one further of the optional components selected from the group consisting of a water-soluble organic solvent and an oxidizing agent is present in the composition.

22. An aqueous composition according to claim 21 wherein both the water-soluble organic solvent and the oxidizing agent are present in the composition and the organic solvent is selected from the group consisting of glycerol, 2-pyrrolidinone, 1-methyl-2-pyrrolidinone, 1-ethyl-2-pyrrolidinone, 1-propyl-2-pyrrolidinone, 1-hydroxyethyl-2-pyrrolidinone, a dialkyl sulfone, dimethyl sulfoxide, a tetrahydrothiophene-1,1-dioxide, dimethylacetamide and dimethylformamide and the oxidizing agent is selected from the group consisting of hydrogen peroxide, persulfates, perphosphates, hyposulfites, hypochlorites.

23. An aqueous composition according to claim 22 wherein the water-soluble organic solvent is glycerol and the oxidizing agent is hydrogen peroxide.

24. A process for cleaning a microelectronic substrate without producing any substantial metal corrosion, the substrate containing photoresist polymeric material and/or residues and a metal, the process comprising contacting the substrate with an aqueous, silicate-free, cleaning composition for a time sufficient to clean the substrate, wherein the aqueous, siliate-free, cleaning composition has a pH of about 6 or below and consists of a composition of claim 19.

25. A process for cleaning a microelectronic substrate without producing any substantial metal corrosion, the substrate containing photoresist polymeric material and/or residues and a metal, the process comprising contacting the substrate with an aqueous, silicate-free, cleaning composition for a time sufficient to clean the substrate, wherein the aqueous, siliate-free, cleaning composition has a pH of about 6 or below and consists of a composition of claim 20.

26. A process for cleaning a microelectronic substrate without producing any substantial metal corrosion, the substrate containing photoresist polymeric material and/or residues and a metal, the process comprising contacting the substrate with an aqueous, silicate-free, cleaning composition for a time sufficient to clean the substrate, wherein the aqueous, siliate-free, cleaning composition has a pH of about 6 or below and consists of a composition of claim 21.

27. A process for cleaning a microelectronic substrate without producing any substantial metal corrosion, the substrate containing photoresist polymeric material and/or residues and a metal, the process comprising contacting the substrate with an aqueous, silicate-free, cleaning composition for a time sufficient to clean the substrate, wherein the aqueous, siliate-free, cleaning composition has a pH of about 6 or below and consists of a composition of claim 22.

28. A process for cleaning a microelectronic substrate without producing any substantial metal corrosion, the substrate containing photoresist polymeric material and/or residues and a metal, the process comprising contacting the substrate with an aqueous, silicate-free, cleaning composition for a time sufficient to clean the substrate, wherein the aqueous, siliate-free, cleaning composition has a pH of about 6 or below and consists of a composition of claim 23.

* * * * *